United States Patent [19]

Okumura

[11] Patent Number: 5,247,214
[45] Date of Patent: Sep. 21, 1993

[54] BI-CMOS OUT BUFFER CIRCUIT FOR CMOS LOGIC

[75] Inventor: Koichiro Okumura, Tokyo, Japan

[73] Assignee: NEC Corporation, Tokyo, Japan

[21] Appl. No.: 799,956

[22] Filed: Nov. 29, 1991

[30] Foreign Application Priority Data

Nov. 28, 1990 [JP] Japan .................. 2-327915

[51] Int. Cl.$^5$ ............ H03K 19/092; H03K 19/02
[52] U.S. Cl. .................. 307/475; 307/451; 307/446
[58] Field of Search .......... 307/446, 451, 454, 475

[56] References Cited

U.S. PATENT DOCUMENTS

| | | | |
|---|---|---|---|
| 4,558,234 | 12/1985 | Suzuki et al. | 307/446 |
| 4,730,132 | 3/1988 | Watanabe et al. | 307/446 |
| 4,926,069 | 5/1990 | Yamazaki | 307/446 |
| 5,043,600 | 8/1991 | Horiuchi | 307/446 |
| 5,047,669 | 9/1991 | Iwamura et al. | 307/446 |

Primary Examiner—Edward P. Westin
Assistant Examiner—Richard Roseen
Attorney, Agent, or Firm—Leydig, Voit & Mayer

[57] ABSTRACT

A semiconductor logic circuit includes a CMOS logic circuit having a first input terminal and first and second MOSFETs serially connected between a power source and a ground. The connection point of the first MOSFET to the second MOSFET serves as a first output terminal. The gates of the first and second MOSFETs are connected to the first input terminal. A partial circuit has second and third input terminals. Third and fourth MOSFETs are serially connected between the power source and ground. A connection point of the third MOSFET to the fourth MOSFETs serves as a second output terminal. The second and third input terminals are connected to the first input terminal and to the first output terminal, respectively. A fifth MOSFET is connected between the power source and the second output terminal and has a gate connected to the first output terminal. And a bipolar transistor and a sixth MOSFET are serially connected between the power source and ground. The bipolar transistor has an input terminal connected to the second output terminal. The sixth MOSFET has an input terminal connected to the first output terminal. And the common connection point of the sixth MOSFET to the bipolar transistor serves as an output terminal of the semiconductor logic circuit.

7 Claims, 3 Drawing Sheets

BI-CMOS OUT BUFFER CIRCUIT FOR CMOS LOGIC

BACKGROUND OF THE INVENTION

The present invention relates to a semiconductor circuit, and more particularly to a BiCMOS logic circuit.

The conventionally proposed BiCMOS logic circuit outputs inverted signals of logical product and logical sum of the input signals in a NOR gate and a NAND gate, respectively, and when a logical output of OR or AND is needed, an inverted logical signal is outputted from a CMOS logic circuit 401 as shown in FIG. 1, and inputted into a BiCMOS inverter circuit of 402 to obtain a normal signal as an output from the BiCMOS circuit.

In FIG. 1, the inputs A, B and C are outputted from the CMOS logic circuit 401 as $\overline{A \cdot B + C}$, and by inverting the same once again at the BiCMOS logic inverter 402, an output of $A \cdot B + C$ and be obtained.

At the time of designing an integrated circuit, an error in estimating the load wiring length may result in insufficient driving capacity of the logic circuit and a buffer circuit capable of high capacitance driving at a high speed may have to be inserted between an output of the logic circuit and the load wiring. Since there are no circuits where inputs and outputs are in the same phase in a BiCMOS circuit, a CMOS inverter and an BiCMOS inverter have to be serially connected and used as a buffer circuit.

According to the method of realizing the AND (or OR) logic with the conventional circuit as mentioned above, a two-stage construction is necessary in order to further invert the logic of the NAND (or OR), resulting in an increased number of stages of the logic gates and making it difficult to increase the switching speed. Similar difficulty in increasing the speed is also found when a buffer circuit of the same phase is constructed with a CMOS inverter + BiCMOS inverter because of increased number of logical gate stages.

SUMMARY OF THE INVENTION

It is an object of the present invention to provide a BiCMOS circuit that can realize logic of a buffer and AND (or OR) of the same phase.

The semiconductor circuit according to the present invention comprises a CMOS logic circuit, a partial circuit including a first N-channel MOSFET serially connected between a power source and the ground and having a connection point thereof is used as an output, the an NMOS logic unit of same construction as the N-channel MOS of the CMOS logic circuit having a gate connected to an output of the CMOS logic circuit, P-channel MOSFETs each having a source connected to the power source, a drain connection to an output of the partial circuit, and a gate connected to an output of the CMOS logic circuit, an NPN bipolar transistor having a collector connected to a power source, a base connected to an output of the partial circuit, and an emitter drain and second N-channel MOSFETs each of whose drains is connected to the emitter of said NPN bipolar transistor as the output terminal, a gate connected to the output of the CMOS logic circuit, and a source.

BRIEF DESCRIPTION OF THE DRAWINGS

The above and other objects, features and advantages of the present invention will be more apparent from the following description taken in conjunction with the accompanying drawings, wherein.

DETAILED DESCRIPTION OF PREFERRED EMBODIMENTS

The present invention will now be described referring to the accompanying drawings.

Figure 2:
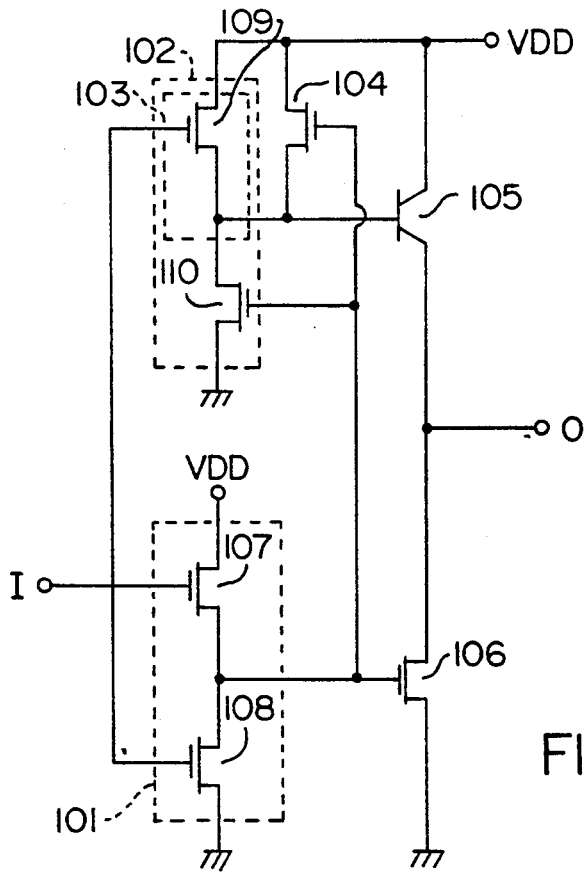
FIG. 2 is a circuit diagram of a buffer circuit according to a first embodiment of the invention.

FIG. 2 shows the diagram of a common-mode buffer circuit which is a first embodiment according to the present invention.

A P-channel MOSFET (hereinafter "PMOS") 107 and an N-channel MOSFET (hereinafter "NMOS") 108 constitute a CMOS logic circuit 101 which outputs an inverted signal from an input signal I. The output of the CMOS circuit 101 is connected to the gate of an NMOS 106 whose drain is connected to the output terminal O and whose source is grounded. The output of CMOS circuit 101 is also connected to the gate of an NMOS 110 whose drain is connected to an NMOS logic unit 103 and whose source is grounded, and to the gate of a PMOS 104 whose drain is connected to the output of a partial circuit 102 and whose source is connected to the power source. The partial circuit 102 comprising an NMOS 109, which constitutes the NMOS logic 103, and the NMOS 110 is a circuit which outputs a signal of the same phase as an input I, and its output point is connected to the base of an NPN bipolar transistor 105 whose collector is connected to the power source VDD, and whose emitter is connected to the output terminal O. When the input I is switched from 1 to 0, the PMOS 107 is enabled and the NMOS 108 disenabled, whereby the potential at the output of the CMOS logic 108 rises from the grounding potential to that of the VDD to turn on the NMOS 106. In the meantime, the NMOS 109 becomes disables as the level of the input I is shifted to 0, and the potential of the partial circuit 102 at the output point lowers toward that of the ground because the NMOS 110 is connected at the gate thereof to the output of the CMOS logic circuit. Further, the PMOS 104 becomes disabled because its gate is connected to the output of the CMOS logic 101 to lower the base potential of the NPN bipolar transistor 105, which in turn becomes disabled and its potential at the output O lowers to that of the ground to output a signal of 0 level. Conversely, when the input I is switched from 0 to 1, the PMOS 107 becomes disenabled while the NMOS 108 is enabled, so that the potential at the output of the CMOS logic circuit 101 lowers toward the grounding potential to disabled the NMOS 106. As the level of the input I is switched to 1, the NMOS 109 becomes enabled first, and the potential of the partial circuit 102 at the output point starts to rise toward a potential which is determined by the resistance ratio between the NMOS 109 and the NMOS 110 when they are turned on. However, as the gate potential of the NMOS 110 and PMOS 104 decline respectively with the switching of the CMOS logic circuit 101, the NMOS 110 rapidly becomes disabled while the PMOS 104 rapidly becomes enabled, the potential of the partial circuit 102 at the output point, or the base potential of the NPN bipolar transistor 105 rapidly rises toward the VDD potential, enabling the NPN bipolar transistor 105, while the potential at the output terminal O rises toward a value which is equivalent to the VDD potential minus the built-in-potential VF between the base and emitter of the NPN bipolar transistor 105 to become 1. Therefore, according to the present invention, a BiCMOS buffer circuit whose input and output are of the same phase is realized, such that when the input I is at 0 level, the output terminal O is also at 0 level, and when the input I is at 1 level the output terminal is at 1 level. The number of gates from the input terminal to the output terminal in the embodiment is also fewer than the conventional circuit, realizing high speed operation.

Figure 3:
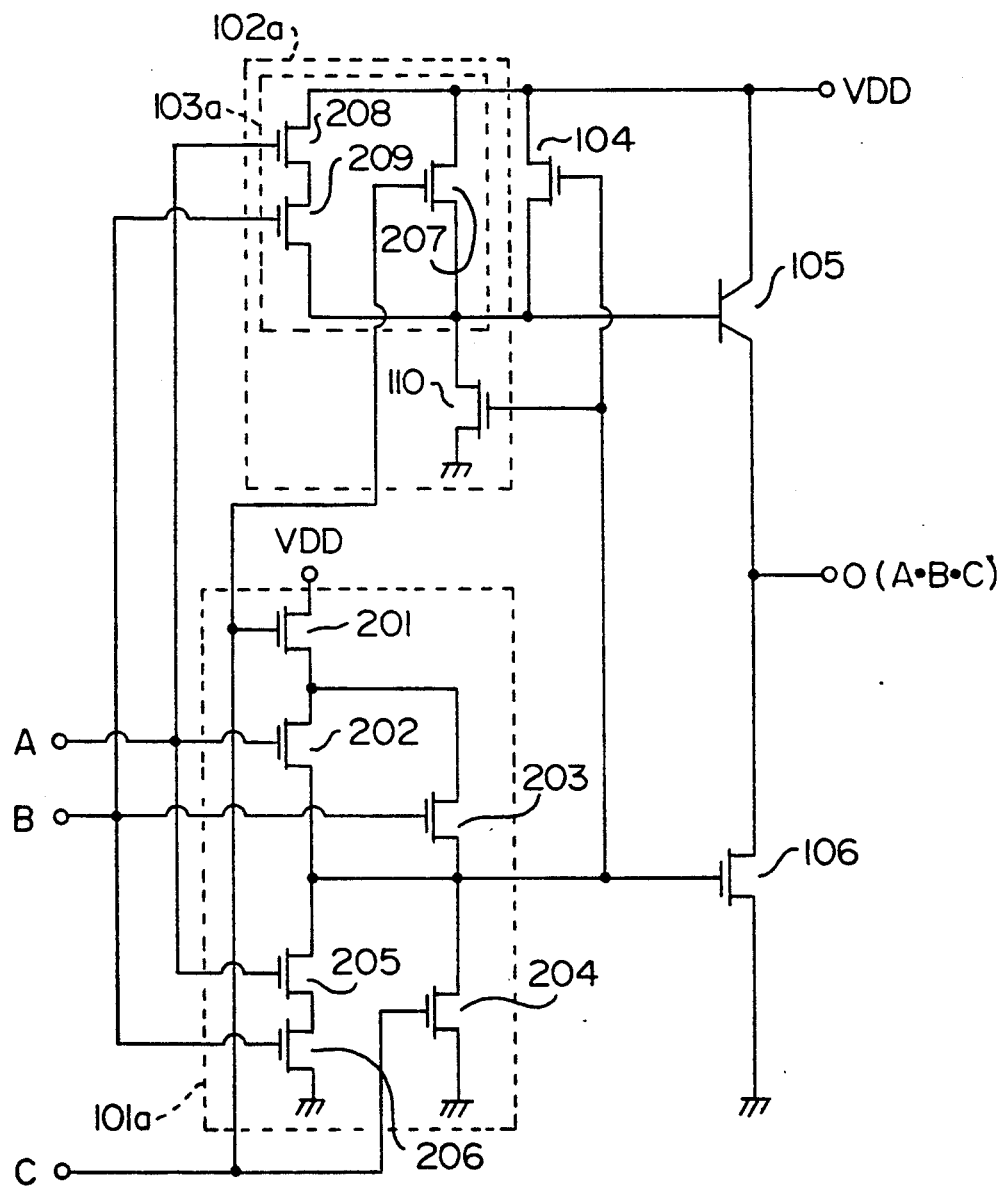
FIG. 3 is a circuit diagram of a logic circuit according to a second embodiment of the invention.

FIG. 3 shows a second embodiment in which the present invention is applied to a logic circuit for obtaining O=A·B+C from inputs A, B and C.

According to this embodiment, the CMOS logic circuit 101a comprises PMOSs 201, 202, 203, and NMOSs 204, 205, 206. For inputs A, B and C, the output point is at 0 level when A·B+C=1, and the output point is at 1 level when A·B+C=0. The NMOS logic unit 103a comprises NMOSs 208 and 209 in serial connection and an NMOS 207 which is in parallel therewith, the construction being the same as that of the CMOS logic circuit 101a on the NMOS side. This embodiment differs from the first embodiment only in that the output point of the partial circuit comprising the NMOS 103a and the NMOS 110 becomes 0 level when A·B+C=0, and 1 level when A·B+C=1. Other features of the construction are the same as the first embodiment shown in FIG. 2. As for the operation, the second embodiment is identical with the first embodiment except that the CMOS logic circuit 101 is replaced with a circuit 101a, the partial circuit 102 with the circuit 102a, the input I=0 with an input A·B+C=0, the input I=1 with A·B+C=1. In other words, when A·B+C=0, the NMOS 106 becomes enabled and the NPN bipolar transistor 105 disabled, so that the output terminal O is switched to 0 level, whereas when A·B+C=1, the NMOS 106 becomes disabled and the NPN bipolar transistor 105 enabled, so that the output terminal O is switched to 1 level, realizing a logic of O=A·B+C.

Figure 1:
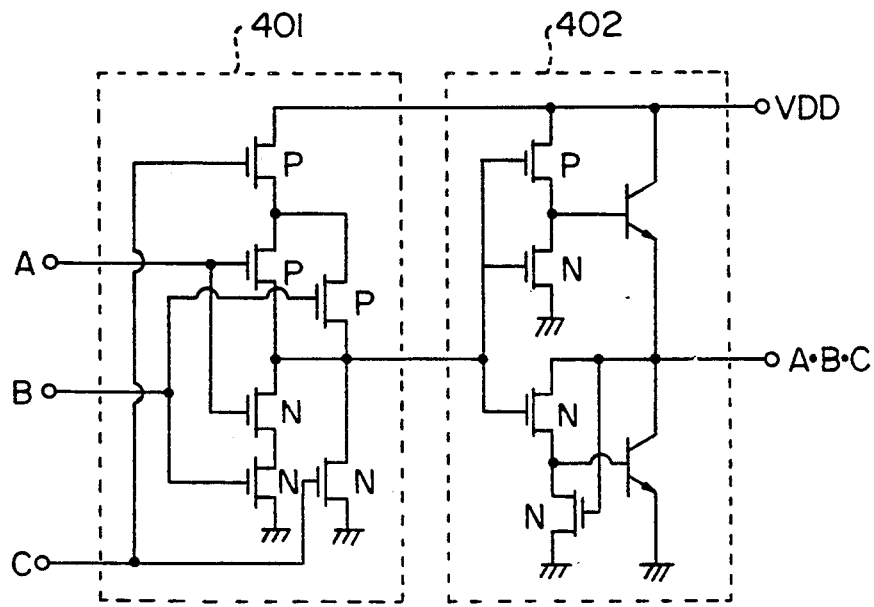
FIG. 1 is a diagram of a prior art circuit construction.

In this embodiment, when it is switched from A·B+C=0 to A·B+C=1, the output point of the partial circuit starts charging first through at least either one of the serial circuits comprising the NMOS 208 and NMOS 209 and the NMOS 207, and then rapidly becomes charged as the output of the CMOS logic circuit changes. Thus, whereas there occurs a delay of three stages of logic gates in the conventional circuit shown in FIG. 1 when the same logic is to be realized, a delay for only two logic gate stages occurs in the embodiment of the invention, enabling high speed operation.

Figure 4:
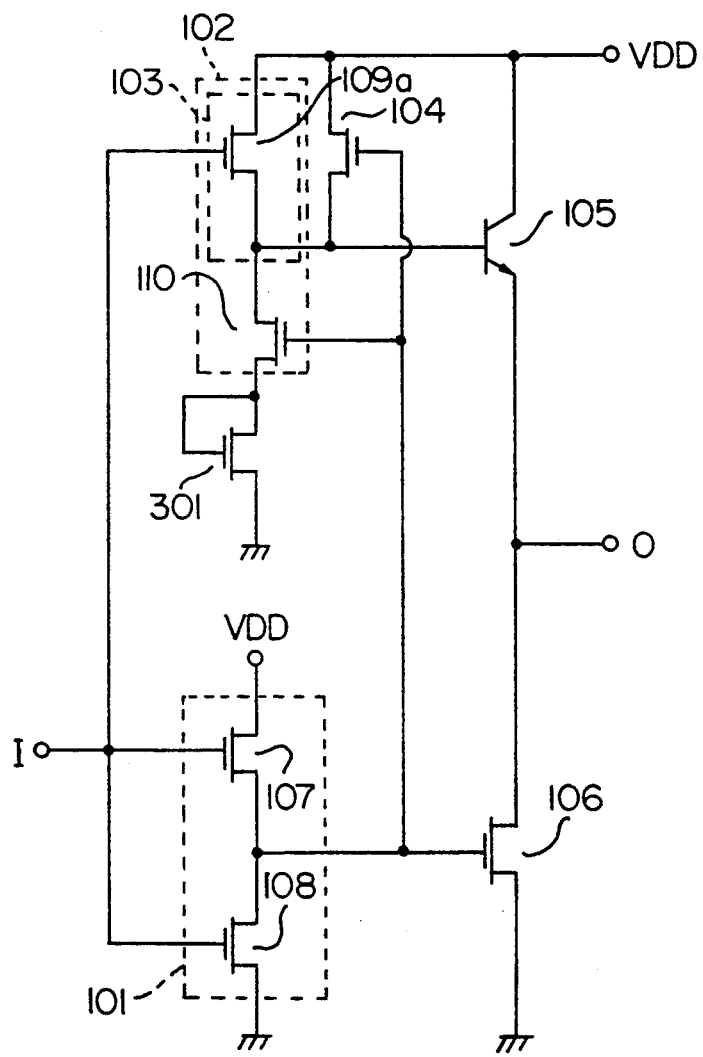
FIG. 4 is a circuit diagram of a third embodiment of the invention.

FIG. 4 is a circuit diagram of the third embodiment according to the present invention, which differs from the first embodiment shown in FIG. 2 in that the NMOS 109a is also an NMOS with a small threshold voltage, and that an NMOS 301 which is small in threshold voltage and whose gate and drain are commonly connected is inserted between the partial circuit 102 and the ground. By setting the threshold voltage of the NMOS 109a of the NMOS logic 103 at a low value, a high value is obtained in the initial charging at the output point of the partial circuit 102 when the input I is switched from 0 to 1, contributing to increased operational speed. Because the NMOS 301 is inserted, if the source potential of the NMOS 109a is increased by the amount of the threshold voltage of the NMOS 301 from the potential of the input I (grounding potential), the NMOS 109a can be maintained disabled. The threshold voltages of the NMOSs 109a and 301 is preferably in the range of from 0.1 to 0.4 V for the reasons stated above.

Effect of the Invention

As has been described in the foregoing, the present invention is effective as a common-mode buffer circuit, AND logic circuits and OR logic circuits can be structured with fewer stages of logic gates, realizing high speed operation.

What is claimed is:

1. A semiconductor logic circuit comprising:
   a CMOS logic circuit including a first P-channel MOSFET connected in series with a first N-channel MOSFET, said first P-channel MOSFET having a gate serving as an input terminal of said semiconductor logic circuit, said first N-channel MOSFET having a gate connected to said input terminal of said semiconductor logic circuit, a connection point of said first P-channel MOSFET to said first N-channel MOSFET serving as an output terminal of the CMOS logic circuit;
   a partial circuit including second and third N-channel MOSFETs serially connected between a power source and a ground, a connection point of said second and third N-channel MOSFETs serving as an output terminal of the partial circuit, said second and third N-channel MOSFETs having the same construction as said first N-channel MOSFET of said CMOS logic circuit, a gate of said third N-channel MOSFET being connected to said output terminal of said CMOS logic circuit, and a gate of said second N-channel MOSFET being connected to said input terminal of said semiconductor logic circuit;
   a second P-channel MOSFET having a source connected to the power source, a drain connected to said output terminal of said partial circuit, and a gate connected to said output terminal of said CMOS logic circuit;
   an NPN bipolar transistor having a collector connected to the power source, a base connected to said output terminal of said partial circuit, and an emitter serving as an output terminal of said semiconductor logic circuit; and
   a fourth N-channel MOSFET having a drain connected to said emitter of said NPN bipolar transistor, a gate connected to said output terminal of said CMOS logic circuit, and a source connected to the ground.

2. The semiconductor logic circuit of claim 1 including a fifth N-channel MOSFET serially connected between the partial circuit and the ground, the fifth N-channel MOSFET having a gate and a drain connected to each other.

3. The semiconductor logic circuit of claim 2 wherein the second and fifth N-channel MOSFETs have voltage thresholds ranging between 0.1 and 0.4 volts.

4. A semiconductor logic circuit comprising:
   a CMOS logic circuit having a first input terminal serving as an input terminal of the semiconductor logic circuit and first and second MOSFETs serially connected between a power source and a ground, the connection point of the first MOSFET to the second MOSFET serving as an output terminal of the CMOS logic circuit, a gate of the first MOSFET and a gate of the second MOSFET being connected to the input terminal of the semiconductor logic circuit;

a partial circuit having first and second input terminals, third and fourth MOSFETs serially connected between the power source and the ground, a connection point of the third MOSFET to the fourth MOSFET serving as an output terminal of the partial circuit, a gate of the third MOSFET being connected to the first terminal of the partial circuit and to the input terminal of the semiconductor logic circuit, and a gate of the fourth MOSFET being connected to the second input terminal of the partial circuit and to the output terminal of the CMOS logic circuit, respectively;

a fifth MOSFET connected between the power source and the output terminal of the partial circuit and having a gate connected to the output terminal of the CMOS logic circuit; and a bipolar transistor and a sixth MOSFET serially connected between the power source and the ground, a base of the bipolar transistor being connected to the output terminal of said partial circuit, the sixth MOSFET having a gate connected to the output terminal of the CMOS logic circuit, and a common connection point of the sixth MOSFET to the bipolar transistor serving as an output terminal of the semiconductor logic circuit.

5. The semiconductor logic circuit of claim 4 including an N-channel MOSFET serially connected between the partial circuit and the ground, the N-channel MOSFET having a gate and drain connected together.

6. The semiconductor logic circuit of claim 5 wherein the N-channel MOSFET has a voltage threshold ranging between 0.1 and 0.4 volts.

7. A semiconductor logic circuit comprising:

a CMOS logic circuit having first, second, and third input terminals, first and second MOSFETs serially connected between a power source and a ground, the connection point of the first MOSFET to the second MOSFET serving as an output terminal of the CMOS logic circuit, a gate of the first MOSFET being connected to the second input terminal, a gate of the second MOSFET being connected to the third input terminal, third, fourth, fifth, and sixth MOSFETs serially connected between the power source and the ground, the first MOSFET being connected to the power source through the third MOSFET, the gate of the third MOSFET being connected to the third input terminal, the gate of the fourth MOSFET being connected to the first input terminal, a connection point of the fourth MOSFET to the fifth MOSFET being connected to the output terminal of the CMOS logic circuit, a gate of the fifth MOSFET being connected to the first input terminal, and a gate of the sixth MOSFET being connected to the second input terminal;

a partial circuit having first, second, and third input terminals, seventh and eighth MOSFETs serially connected between the power source and the ground, a connection point of the seventh MOSFET to the eighth MOSFET serving as an output terminal of the partial circuit, a gate of the seventh MOSFET being connected to the third input terminal of the CMOS logic circuit, a gate of the eighth MOSFET being connected to the output terminal of the CMOS logic circuit, ninth and tenth MOSFETs serially connected between the power source and the output terminal of the partial circuit, a gate of the ninth MOSFET being connected to said first input terminal of the CMOS logic circuit, and a gate of the tenth MOSFET being connected to the second input terminal of the CMOS logic circuit;

an eleventh MOSFET connected between the power source and the output terminal of the partial circuit, a gate of the eleventh MOSFET being connected to the output terminal of the CMOS logic circuit; and a bipolar transistor and a twelfth MOSFET serially connected between the power source and the ground, the bipolar transistor having a base connected to the output terminal of the partial circuit, the twelfth MOSFET having a gate connected to the output terminal of the CMOS logic circuit, a connection point of the twelfth MOSFET to the bipolar transistor serving as an output terminal of the semiconductor logic circuit, whereby when signals input to the first, second, and third input terminals of the CMOS logic circuit are A, B, and C, respectively, a signal is produced at the output terminal of the semiconductor logic circuit equal to $A \cdot B + C$.

* * * * *